United States Patent [19]

Duda et al.

[11] 4,321,617
[45] Mar. 23, 1982

[54] SYSTEM FOR SOLDERING A SEMICONDUCTOR LASER TO A METAL BASE

[75] Inventors: Eugène Duda; Alain Maumy; Claude Tondu, all of Paris, France

[73] Assignee: Thomson-CSF, Paris, France

[21] Appl. No.: 58,925

[22] Filed: Jul. 19, 1979

[30] Foreign Application Priority Data

Jul. 25, 1978 [FR] France ................... 78 21969

[51] Int. Cl.³ ........................... H01L 21/60
[52] U.S. Cl. ........................ 357/71; 357/67; 228/123; 228/124
[58] Field of Search .......... 228/123, 124, 263 A, 228/116; 357/71, 18; 331/94.5 H

[56] References Cited

U.S. PATENT DOCUMENTS

| 3,396,454 | 8/1968 | Murdock et al. | 357/71 |
| 3,609,471 | 9/1971 | Scace et al. | 228/123 X |
| 3,798,746 | 3/1974 | Alphonse et al. | 228/116 |
| 3,883,946 | 5/1975 | Dale | 228/123 X |
| 4,064,621 | 12/1977 | Lo | 357/18 X |
| 4,179,533 | 12/1979 | Christou et al. | 357/71 X |

FOREIGN PATENT DOCUMENTS 1331980  9/1973  United Kingdom ............... 128/123

OTHER PUBLICATIONS

Manko *Solders and Soldering*, McGraw-Hill, Inc., New York, N.Y., 1964, pp. 104–105.

*Primary Examiner*—John McQuade
*Assistant Examiner*—Kenneth J. Ramsey
*Attorney, Agent, or Firm*—Cushman, Darby & Cushman

[57] ABSTRACT

A GaAs diode and a copper base are joined together so as to form a soldered system comprising an indium layer inserted between two tungsten layers which serve as a barrier for preventing indium diffusion. A thin gold or platinum wetting layer is applied to the tungsten layers to aid in adherence of the solder to the tungsten without the impairment of the indium during soldering operations due to alloying. The invention is applicable to optical-fiber telecommunication systems.

7 Claims, 2 Drawing Figures

SYSTEM FOR SOLDERING A SEMICONDUCTOR LASER TO A METAL BASE

In the field of electroluminescent diodes and especially the so-called laser diodes, it proves difficult in practice to solder the diode to a heat-dissipating and electrically-conducting base.

A wholly suitable material for the fabrication of the base is copper. The assembly of a semiconducting material and copper presents the problem of the difference in coefficients of expansion which gives rise to stresses at the time of operation. Up to the present time, indium has been employed for soldering since it is a soft metal and serves to minimize the stresses. Unfortunately, indium forms alloys with the majority of metals and these alloys produce an extensive modification of its properties, thus impairing the soldered joints.

The invention is directed to a system for the assembly of an electroluminescent semiconductor component and a metallic substance which makes it possible to overcome the disadvantage mentioned above while still employing indium as an intermediate layer.

The system of assembly of an electroluminescent diode and of a heat-dissipating and electrically-conducting base essentially comprises an indium layer placed between two metal layers forming diffusion barriers on the one hand between the indium and the base and on the other hand between the semiconductor material and the metals deposited on this latter, the two layers being endowed with both good thermal conductivity and suitable coefficients of expansion.

A better understanding of the invention will be gained from the following description, reference being made to the accompanying drawings, wherein:

FIG. 1 shows in perspective a diode laser formed of epitaxial layers having a base of gallium arsenide (GaAs) containing a greater or lesser quantity of aluminum in the different layers. Said diode is provided with a light-emitting active zone 201 and is further provided on its top face with an electric contact 202 which is deposited in accordance with any known technique.

In order to ensure correct operation of a diode of this type, the side corresponding to the epitaxial layers must be soldered to a sufficiently massive substrate formed of good heat-conducting material which ensures heat removal and also provides an electric contact.

This material advantageously consists of copper. Unfortunately, there has not existed up to the present time any satisfactory method for soldering gallium arsenide to copper.

The most efficacious soldered joints or junctions were formed in the prior art by means of a layer of indium which has the advantage of being a soft metal and thus makes it possible to prevent stresses arising from the difference between the coefficient of expansion of AsGa ($5 \times 10^{-6}$) and the coefficient of expansion of copper ($16 \times 10^{-6}$).

In order to improve the quality of contacts, however, it is found necessary on the one hand to deposit a gold layer on the copper prior to soldering and on the other hand to deposit layers of gold or of other metals on the bottom surface of the laser. In point of fact, indium and gold diffuse very rapidly at room temperature. Since gold forms an alloy with indium in the cold state, the soldering operation must be performed rapidly by heating to a temperature above the melting point of indium such as 180° C. for example; otherwise there is formed a $AuIn_2$ alloy haviang a higher degree of hardness and a melting point of 544° C. It is therefore a difficult matter to form a soldered junction and this results in lack of reproducibility in the quality of junctions.

The same phenomenon again takes place in regard to the metal deposited on the laser diode inasmuch as the coefficient of expansion of the $AuIn_2$ alloy is no longer suitable, thus giving rise to thermal stresses in the laser.

In consequence of the foregoing, the properties of indium are impaired during soldering operations and it is for this reason that no suitable result has been achieved in this respect up to the present time.

The invention makes it possible to overcome these disadvantages while retaining indium as a soldering metal.

Figure 1:
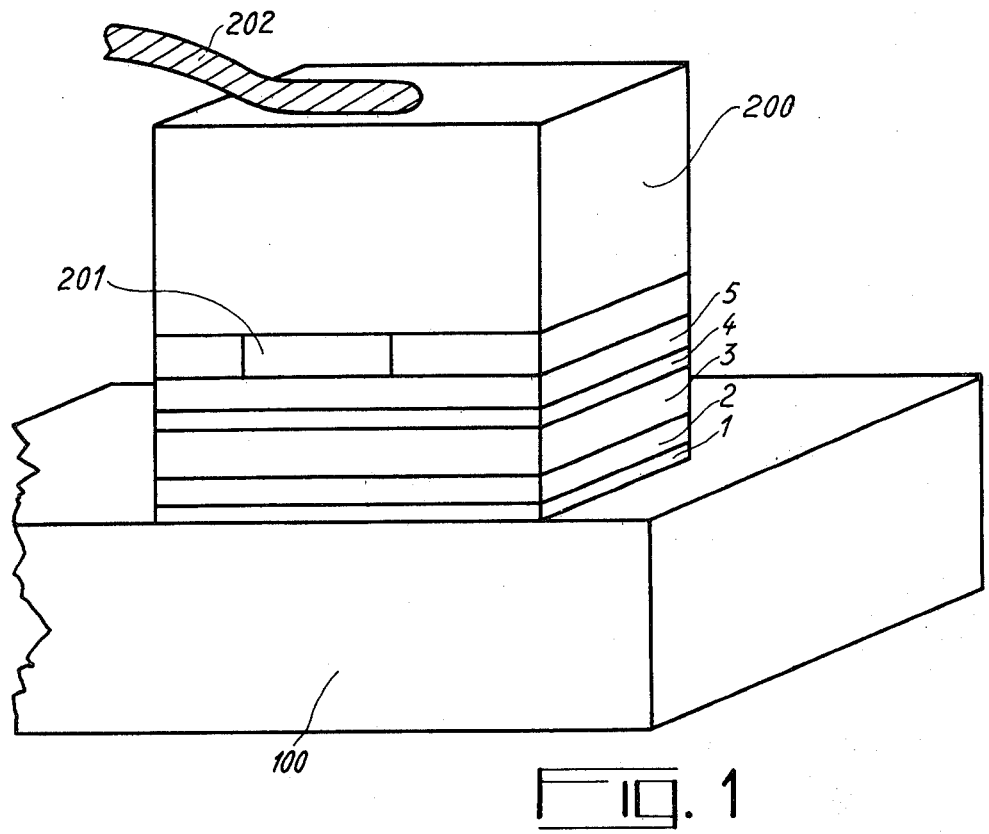
FIG. 1 is a perspective view showing one exemplified embodiment of the invention.
Figure 2:
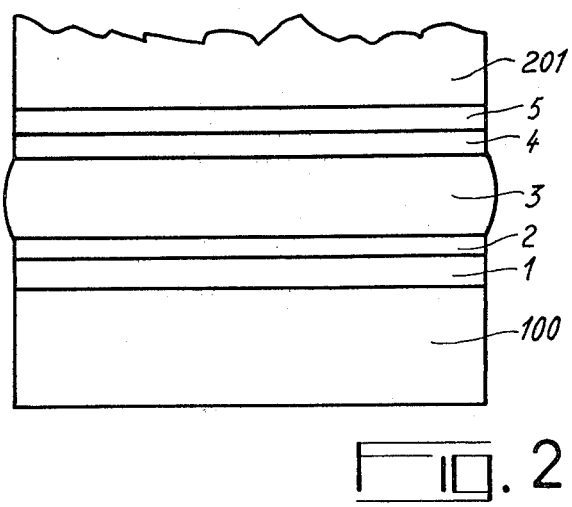
FIG. 2 shows a detail of FIG. 1.

FIG. 2 shows the copper base 100 on which the soldering operation is to be performed.

A tungsten layer 1 having a thickness of approximately 1000 Angströms was deposited on said base by any known method (electron gun, cathodic sputtering). There was then deposited a gold layer 2 having a thickness of the order of 500 Angströms and finally an indium layer 3 having a thickness of 1 to 3 $\mu M$. The presence of gold is necessary since tungsten cannot readily be wetted by indium. Similarly, a tungsten layer 5 having a thickness of 200 to 1000 Angströms followed by a gold or platinum layer 4 having a thickness of 500 Angströms were deposited on the laser component.

The gold layers are of sufficiently small thickness to prevent any impairment of the properites of the indium since very limited formation of $AuIn_2$ takes place. The thickness of the tungsten layer is optimized in order to limit stresses.

The presence of tungsten on both faces of the soldered junction largely prevents the formation of indium alloy, thus enabling the indium to perform its function to the full extent. This accordingly results in good reproducibility of soldered junctions, in good thermal and electric contacts, in reduction of stresses as a result of the practically complete absence of indium alloy, in absence of deterioration of contacts during the lifetime of the component and finally in the possibility of diode laser operation at a temperature of the order of 70° C.

One point worthy of note is the fact that, among ordinary metals, tungsten appears to be the only metal which is capable of constituting an effective barrier to diffusion of indium. Moreover, tungsten has good thermal conductivity of the order of 1.8 W/cm−° C.

Finally, the layers of gold and indium must be localized beneath the laser in order to prevent any lateral diffusion of the indium.

What is claimed is:

1. A semiconductor device comprising: a semiconductor having a bottom, a metallic substrate for supporting said semiconductor body and bonding means for soldering said bottom onto a face of said metallic substrate; said bonding means comprising two barrier layers of a first metal respectively deposited onto said bottom and said face, two wetting layers of a second metal respectively deposited onto said barrier layers and a further layer of soft solder material made of indium joining together said two wetting layers at least a portion of said wetting layers forming an alloy with a small portion of said solder material; said barrier layers preventing said soft solder material from alloying with said semiconductor body and said metallic substrate; the thickness of said wetting layers being small enough to prevent impairment of said soft solder material due to alloy formation.

2. A device according to claim 1, wherein the barrier layers are formed of tungsten and the substrate is formed of copper.

3. A device according to claim 2, wherein the semiconductor has a base of gallium arsenide GaAs.

4. A device according to claim 3, wherein the wetting layers are formed of gold or platinum.

5. A device according to claim 4, wherein the indium solder material has a thickness of the order of 1 to 10 $\mu$m, the barrier layers have a thickness of the order of 0.02 to 0.1 $\mu$m, the wetting layers have a thickness of the order of 0.05 $\mu$m to 0.10 $\mu$m.

6. A device according to claim 1, wherein the barrier layers are localized beneath the semiconductor body and thus prevent lateral diffusion of the soft metal.

7. An integrated optical device, wherein said device comprises soldering systems according to claim 1.

* * * * *